United States Patent [19]
Pinney

[11] Patent Number: 6,111,773
[45] Date of Patent: Aug. 29, 2000

[54] MEMORY CIRCUIT HAVING IMPROVED SENSE-AMPLIFIER BLOCK AND METHOD FOR FORMING SAME

[75] Inventor: David L. Pinney, Boise, Id.

[73] Assignee: Micron Technology, Inc., Boise, Id.

[21] Appl. No.: 09/143,164

[22] Filed: Aug. 28, 1998

[51] Int. Cl.[7] .................................................. G11C 5/02
[52] U.S. Cl. ............................ 365/51; 365/63; 365/205
[58] Field of Search ................................. 365/205, 207, 365/51, 63

[56] References Cited

U.S. PATENT DOCUMENTS

| | | | |
|---|---|---|---|
| 4,825,417 | 4/1989 | Seo | 365/205 |
| 4,903,344 | 2/1990 | Inoue | 365/51 |
| 4,922,459 | 5/1990 | Hidaka | 365/206 |
| 5,644,525 | 7/1997 | Takashima et al. | 365/51 |
| 5,859,805 | 1/1999 | Takashima et al. | 365/205 |

*Primary Examiner*—Huan Hoang
*Assistant Examiner*—Gene N. Auduong
*Attorney, Agent, or Firm*—Dorsey & Whitney LLP

[57] ABSTRACT

A memory circuit includes first and second amplifier stages that are respectively located within first and second regions of a semiconductor structure, and a memory array that is also located in the semiconductor structure. The memory circuit also includes a first set of digit lines that is coupled to the memory array, extends from the memory array into the first region, and is coupled to the first amplifier stage. The memory circuit further includes a second set of digit lines that is coupled to the memory array, extends from the memory array through the first region and into the second region, is coupled to the second amplifier stage, and is electrically isolated from the first amplifier stage.

36 Claims, 10 Drawing Sheets

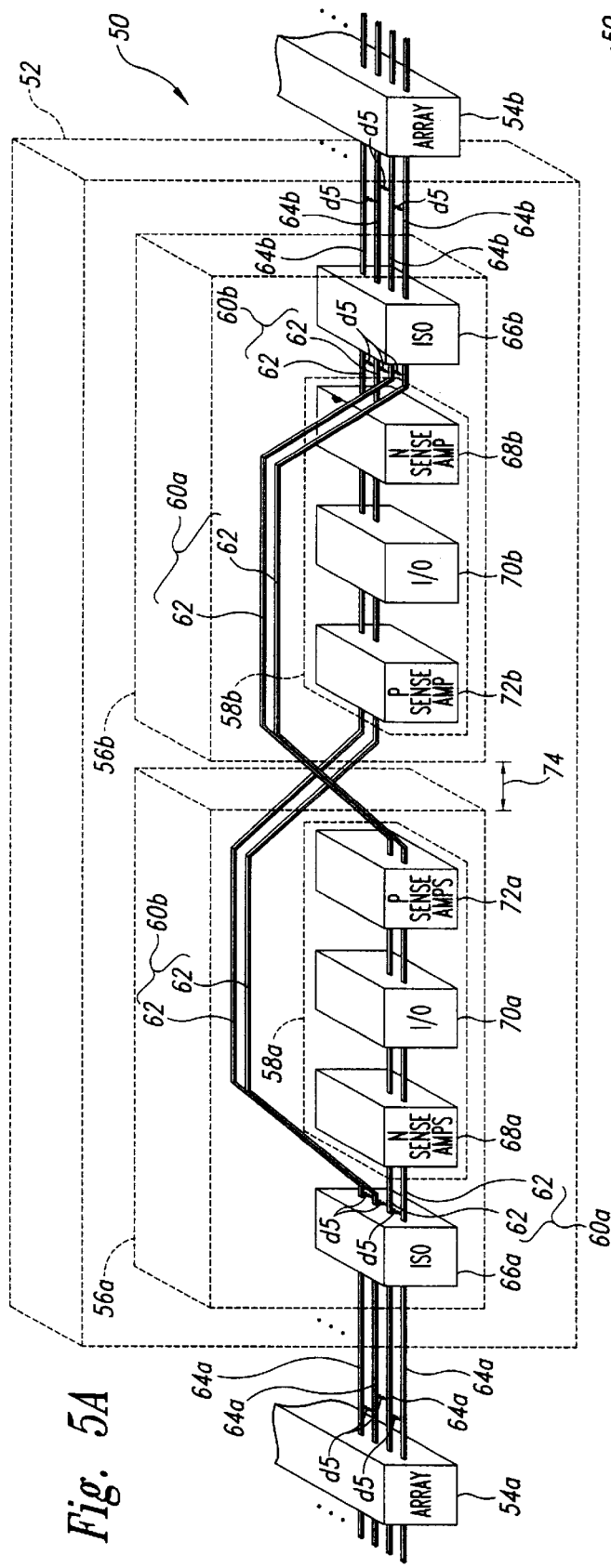
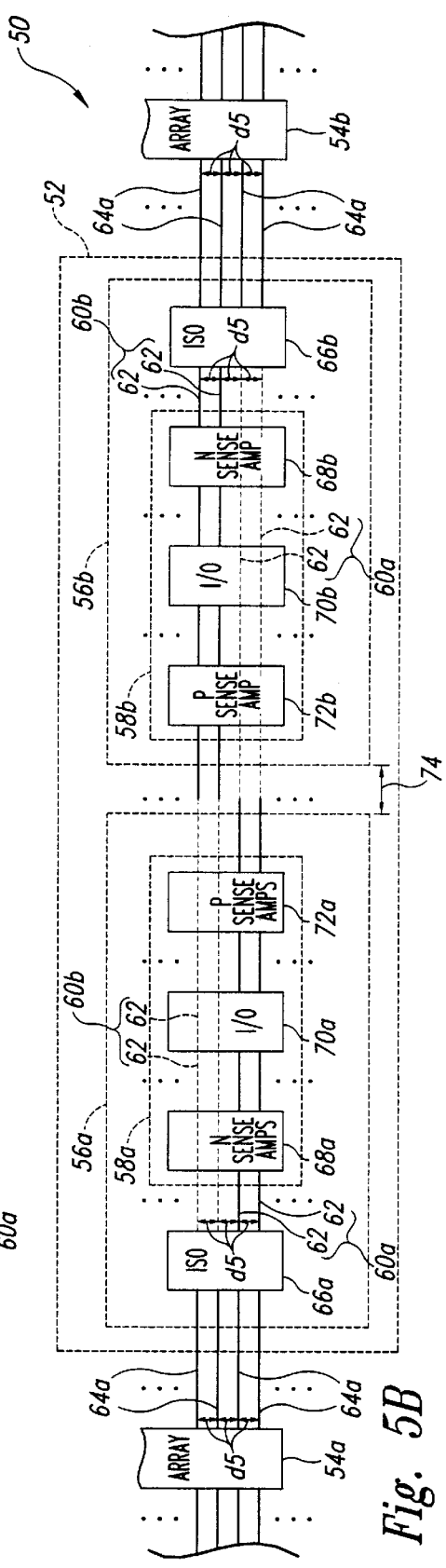
Fig. 5A
Fig. 5B

MEMORY CIRCUIT HAVING IMPROVED SENSE-AMPLIFIER BLOCK AND METHOD FOR FORMING SAME

TECHNICAL FIELD

The invention relates generally to integrated circuits, and more particularly to a memory circuit having a sense-amplifier block that receives a large number of digit lines per given block width and a method for laying out the block.

BACKGROUND OF THE INVENTION

Today's memory designers continually strive to increase the data-storage density of memory arrays. FIG. 1 is a schematic diagram of a conventional memory circuit 8, which includes multiple memory-array sections 10 and 12 and sense-amplifier blocks 13. For clarity, only two array sections 10 and 12 are shown in FIG. 1. The allay sections 10 and 12 each include memory cells 14, which each include an access transistor 16 and a storage capacitor 18. Each of the cells 14 is coupled to a respective word line 20, which is driven by a respective row decoder 22. Each cell 14 is also coupled to a respective digit line 24. The digit lines 24 are arranged in laterally spaced complementary (D and $\overline{D}$) pairs 15, each pair being alternately coupled to a respective one of the sense-amplifier blocks 13 on a different side of the respective array section 10 or 12. For example, one set of aligned digit-line pairs 15a and 15b in the array sections 10 and 12 are coupled to the same one of the sense-amplifier blocks 13a, which is disposed between the array sections 10 and 12. Therefore, an adjacent digit-line pair 15c in the allay section 10 is coupled to a respective one of the sense-amplifier blocks 13b, and an adjacent digit-line pair 15d in the array section 12 is coupled to a respective one of the sense-amplifier blocks 13c. (The sense-amplifier blocks 13b and 13c may also be coupled to additional respective array sections not shown in FIG. 1.) Although shown as receiving one digit-line pair 15 from each side, each of the blocks 13 may receive multiple digit-line pairs 15 from each side. The blocks 13 each include isolation circuits 27, which couple the selected array section 10 or 12 to sense amplifiers 11 during a read or write cycle.

Furthermore, each digit line 24 is coupled to the memory cells 14 in every other row of the respective array section 10 or 12. That is, one digit line 24 of respective digit-line pairs 15 is coupled to the memory cells 14 in a respective even row, and the other digit line 24 of the same digit-line pair 15 is coupled to the memory cells 14 in a respective odd row. This type of layout is known as a folded digit-line architecture, and is typically used to reduce the amount of noise on the digit lines 24. Because the circuit 8 is laid out according to a folded digit-line architecture, the memory cells 14 each occupy approximately 8 square feature sizes. (A feature size is the minimum dimension, such as a line or transistor gate width, realizable with the semiconductor process used to manufacture the circuit 8.).

Still referring to FIG. 1, in operation during a read or write cycle, one or more memory cells 14 within a selected one of the array sections 10 and 12 are addressed, and the isolation circuits 27 couple the digit lines 24 that are connected to the addressed memory cells 14 to the respective sense amplifiers 11 and isolate the digit lines 24 that are connected to the unaddressed memory cells 14 from the sense amplifiers 11. During a write cycle, data is coupled from a data bus to write drivers (both not shown in FIG. 1), which drive the data through an input/output circuit 34 onto the respective digit lines 24 and into the addressed memory cells 14. During a read cycle, the respective sense-amplifier blocks 13 couple data from the addressed memory cells 14 to the data bus through the input/output circuit 34.

FIG. 2 is a schematic block diagram of the sense-amplifier blocks 13, the array sections 10 and 12 and another array section 30, and the respective interfaces 31 therebetween. In this embodiment, each sense-amplifier block 13 receives four digit-line pairs 15 from each array section 10, 12, and includes pairs of complementary digit lines 32 that respectively correspond to the received pairs 15 of complementary digit lines 24. The isolation circuits 27 are coupled to the digit lines 24 of a respective array sections 10, 12, and 30 and to the digit lines 32. As discussed above in conjunction with FIG. 1, the respective isolation circuits 27 couple the digit lines 24 that are connected to the memory cells 14 to the digit lines 32 during a read or write cycle. Additionally, each block 13 includes a conventional input/output circuit 36, which couples the digit lines 32 to complementary I/O lines 38 during a read or a write cycle, and isolates the digit lines 32 from the I/O lines 38 otherwise. Each of the sense amplifiers 11 may also include conventional circuitry for equilibrating the digit lines 32 and the digit lines 24 before a read cycle. Each block 13 also includes a conventional PMOS sense-amplifier section 33, which includes pairs of PMOS transistors (not shown in FIG. 2) that are respectively coupled to the pairs of digit lines 32. Each block 13 further includes a conventional NMOS sense-amplifier section 34, which includes corresponding pairs of NMOS transistors (not shown in FIG. 2) that are also respectively coupled to the pairs of digit lines 32. The corresponding pails of PMOS and NMOS transistors together form the respective sense amplifiers 11 (FIG. 1), one for each pair 15 of the digit lines 32.

Still referring to FIG. 2, the digit lines 24 emerge from the respective array sections 10, 12, and 30 in the same semiconductor layer and with a certain lateral spacing called the pitch. For example, the pitch between the digit lines 24 in the same pair 15 is a distance d1, and the pitch between adjacent digit lines 24 in different pairs 15 is a distance d2. In the illustrated embodiment, d2 is approximately 3d1, although this ratio may be different for other array sections. The sense-amplifier blocks 13 are often constructed to receive the digit lines 24 in the same semiconductor layer and at the same pitch at which they emerge from the respective array section. Therefore, the blocks 13 are typically constructed so that along any one side of a respective array section, the sum of the respective widths w of all the blocks 13 adjacent to this array side are no more than the width W of the array. Thus, the array sections 10, 12, and 30 and the blocks 13 occupy the same total width so as to use the layout area of the circuit 8 in an efficient manner. This geometry inherently limits the number of digit lines 24, 32 that can extend through the array sections 10, 12, 30 and the blocks 13.

Referring to FIG. 3, one way to increase the data-storage density of a memory circuit is to layout the array sections according to a bi-level digit-line architecture. Generally, the density of an array section is limited by the lateral spacing of digit lines. In the bi-level architecture, the array sections include additional layers of digit lines stacked on top of each other. In such an architecture, bi-level digit lines 42 in the same complementary pair 43 are located in different semiconductor layers so that one digit line 42 of the pair 43 is disposed atop the other digit line 42 of the same pair 43. As the digit lines 42 emerge from the array section, however, the digit lines 42 of each pair 43 may be routed such that they are in the same semiconductor layer. This architecture allows the memory cells 14 (FIG. 1) to each have an area of approximately 6 square feature sizes instead of the approximately 8 square feature sizes required by each memory cell 14 in the folded-digit-line circuit 8 of FIG. 1. But, because the bi-level architecture allows an additional layer of digit lines 42 within a given area, the bi-level architecture also increases the density of the digit lines 42 in each array section. This bi-level digit-line architecture is discussed more in detail in "A Novel Architecture for Advanced High Density Dynamic Random Access Memories, A Thesis Presented in Partial Fulfillment of the Requirements for the Degree of Master of Science with a Major in Electrical Engineering in the College of Graduate Studies University of Idaho" by Brent Keeth (May 1996), which is incorporated by reference.

FIG. 4 is a proposed schematic block diagram of a memory circuit 41 that includes array sections 44 laid out according to a bi-level digit-line architecture and coupled to the sense-amplifier blocks 13. (Bi-level digit line architecture is an architecture that has been designed only recently, and a memory circuit using the bi-level architecture that includes sense-amplifier blocks has not yet been developed.) Referring to FIGS. 3 and 4, as they emerge from the side of the respective array 44, the digit lines 42 are routed with a tighter pitch than the laterally spaced digit lines 24 of FIG. 1. Additionally, the digit lines 42 are disposed in the same semiconductor layer as they emerge from the respective array section 44. So that the bi-level array section 44 can be constructed to have a width that is the same or smaller than the width W of the array sections 10, 12, and 30 of FIG. 2, the pitch d3 between digit lines 42 of the same digit-line pair 43 is approximately the same as the pitch d4 between adjacent digit lines 42 of different pairs 43. Typically, the pitches d3 and d4 are equal to the pitch d1 of FIG. 1. Therefore, the array sections 44 each have a width that is approximately equal to the width W even though the array sections 44 each include twice the number of digit lines as each of the array sections 10, 12, and 30 of FIG. 2.

Still referring to FIG. 4, a problem with this layout is that it is difficult to use the sense-amplifier blocks 13 with the array sections 44. For example, because the array sections 44 each have twice the number of digit lines 42, the memory circuit 41 has twice as many sense-amplifier blocks 13. Therefore, the combined widths w of the sense-amplifier blocks 13 are equal to at least 2W, which is at least twice as wide as the widths of the array sections 44. Therefore, the array sections 44 in a same column of array sections would be separated by respective areas having widths of at least W. Furthermore, because it would be difficult to form circuitry in these separation areas, these areas would significantly increase the overall area of the memory circuit 41, perhaps even by an amount greater than the area savings realized by the array sections 44 having the bi-level architecture. Additionally, as discussed above in conjunction with FIG. 2, the blocks 13 are constructed to receive digit lines at a pitch of d1 between digit lines of the same pair and at a pitch of d2 between adjacent digit lines of different pairs. Therefore, the digit lines 42 must be routed according to these pitches after they emerge from the array sections 44.

Although the above discussion focuses primarily on a bi-level architecture, similar problems would also be experienced with array sections 44 having more layers of digit lines 24 than two, such as a tri-level architecture. In fact, as each layer of digit lines 24 is added, the problem is worsened as the additional digit lines 24 require additional sense-amplifier blocks 13. Each additional sense-amplifier block 13 increases the width of the separation areas between the array sections 44, significantly increasing the overall area of the memory circuit 41. Similarly, this problem can exist for all types of layout configurations for array sections 44, such as open digit line and folded digit line architecture.

SUMMARY OF THE INVENTION

In one aspect of the present invention, a memory circuit includes first and second amplifier stages that are respectively located within first and second regions of a semiconductor structure, and a memory array that is also located in the semiconductor structure. The memory circuit also includes a first set of digit lines that is coupled to the memory array, extends from the memory array into the first region, and is coupled to the first amplifier stage. The memory circuit further includes a second set of digit lines that is coupled to the memory array, extends from the memory array through the first region and into the second region, is coupled to the second amplifier stage, and is electrically isolated from the first amplifier stage.

Such a memory circuit can incorporate bi-level array sections without large separation areas therebetween.

BRIEF DESCRIPTION OF THE DRAWINGS

The file of this patent contains at least one drawing executed in color. Copies of this patent with color drawing (s) will be provided to the Patent and Trademark Office upon request and payment of the necessary fee.

FIG. 5A is an isometric block diagram of a memory circuit in accordance with one embodiment of the invention.

FIG. 5B is a top view of the memory circuit of FIG. 5A.

DETAILED DESCRIPTION OF THE INVENTION

Figure 5C:
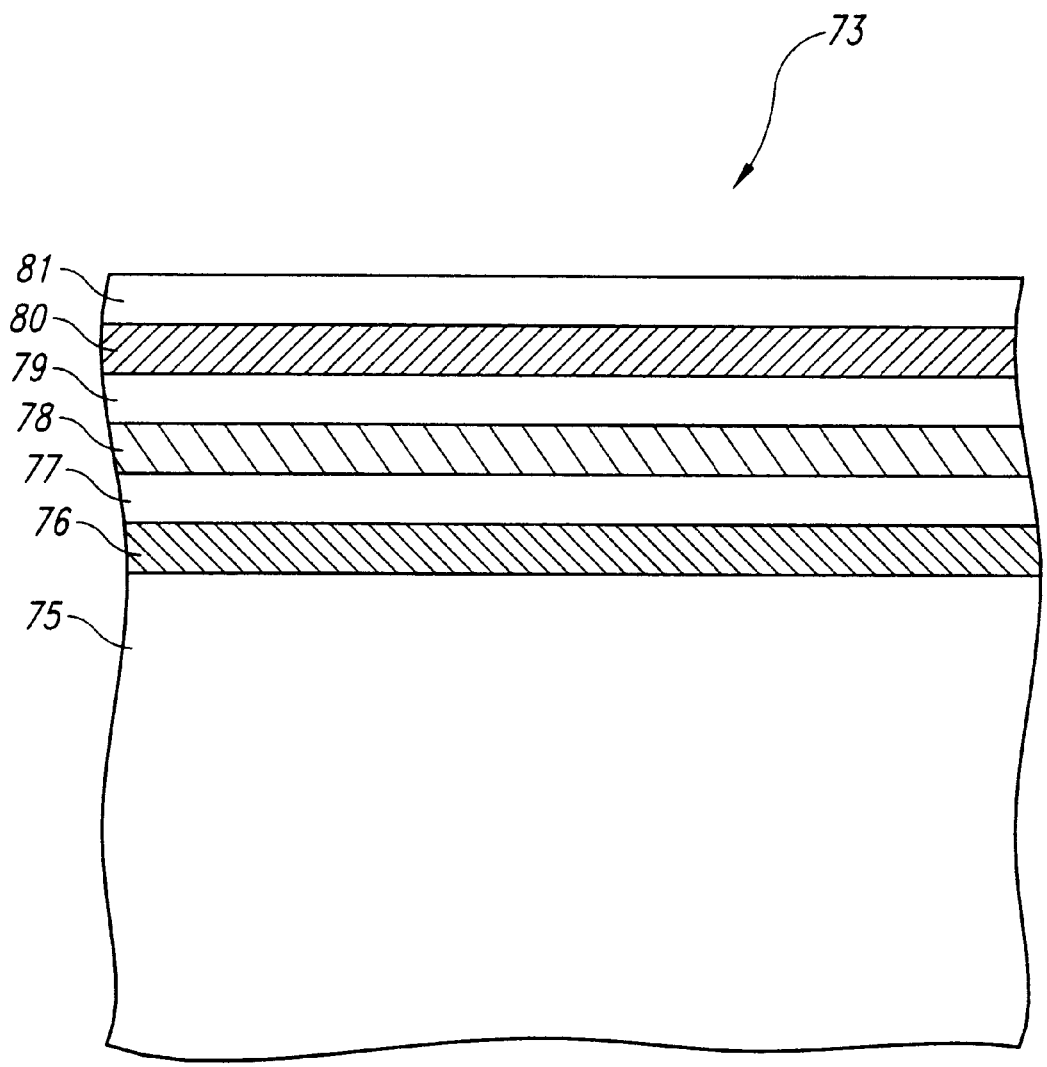
FIG. 5C is a cross section of one embodiment of a semiconductor structure in which the memory circuit of FIGS. 5A and 5B is disposed.

FIGS. 5A and 5B are respective isometric and top views of a memory circuit 50 according to an embodiment of the invention, and FIG. 5C is one embodiment of a cross section of a semiconductor structure in which the circuit 50 is so disposed.

The circuit 50 includes sense-amplifier blocks 52, which are disposed between and coupled to adjacent bi-level allay sections 54. The array sections 54 are similar to the bi-level array sections 44 of FIG. 4. Digit lines 64 emerge from the sides of the array sections 54 at a pitch d5. Each block 52 includes two semiconductor regions 56a and 56b and two sense-amplifier stages 58a and 58b respectively disposed therein. In one embodiment, each stage 58a and 58b is similar to a sense-amplifier block 13 of FIG. 2. Each block 52 also includes two sets 60a and 60b of digit lines 62. The set 60a of digit lines 62 extends through the first region 56a and is coupled to the first amplifier stage 58a, and also extends through the second region 56b and is electrically isolated from the second amplifier stage 58b. Conversely, the set 60b of digit lines 62 extends through the second region 56b and is coupled to the second amplifier stage 58b, and extends through the first region 56a and is electrically isolated from the first amplifier stage 58a. Thus, as described below, such routing of the digit lines 62 allows the block 52 to receive digit lines 64 at the same pitch d5 at which they emerge from their respective bi-level array section 54. This allows the combined widths of the blocks 52 to be no more than the width of the adjacent array sections 54, and thus allows the array sections 54 to be separated by areas that are significantly smaller than the separation areas of FIG. 4.

Figure 4:
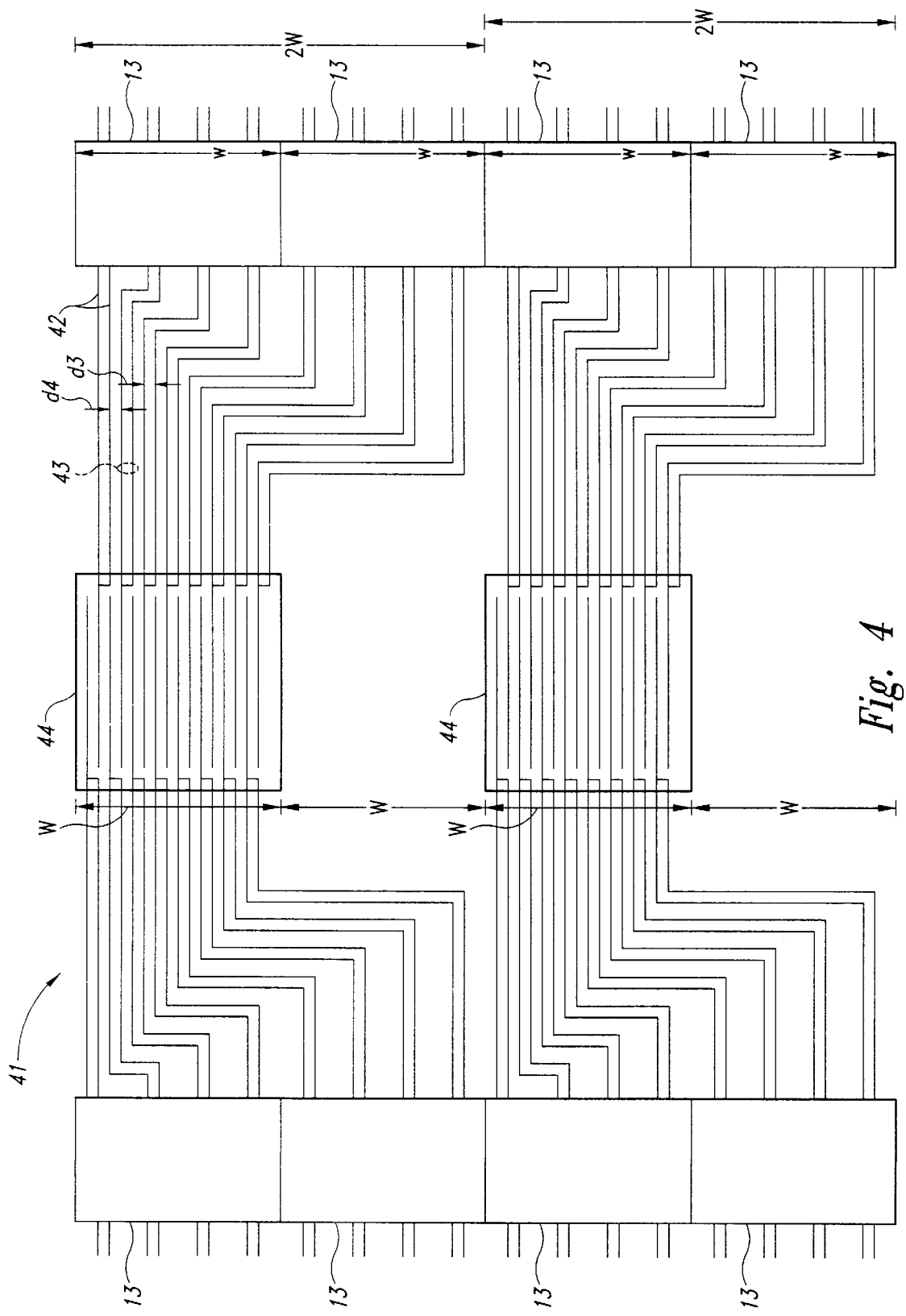
FIG. 4 is a block diagram of a bi-level array section coupled to sense-amplifier blocks like the sense-amplifier blocks of FIG. 2.

One effect of using the above described geometry is that the length of the sense-amplifier block is increased: typically doubled. This effect, however, is an acceptable tradeoff for increasing the overall density of circuitry for the memory device by placing circuitry in the formerly unusable space between the memory array sections 44 (as seen in FIG. 4), as described below.

Figure 1:
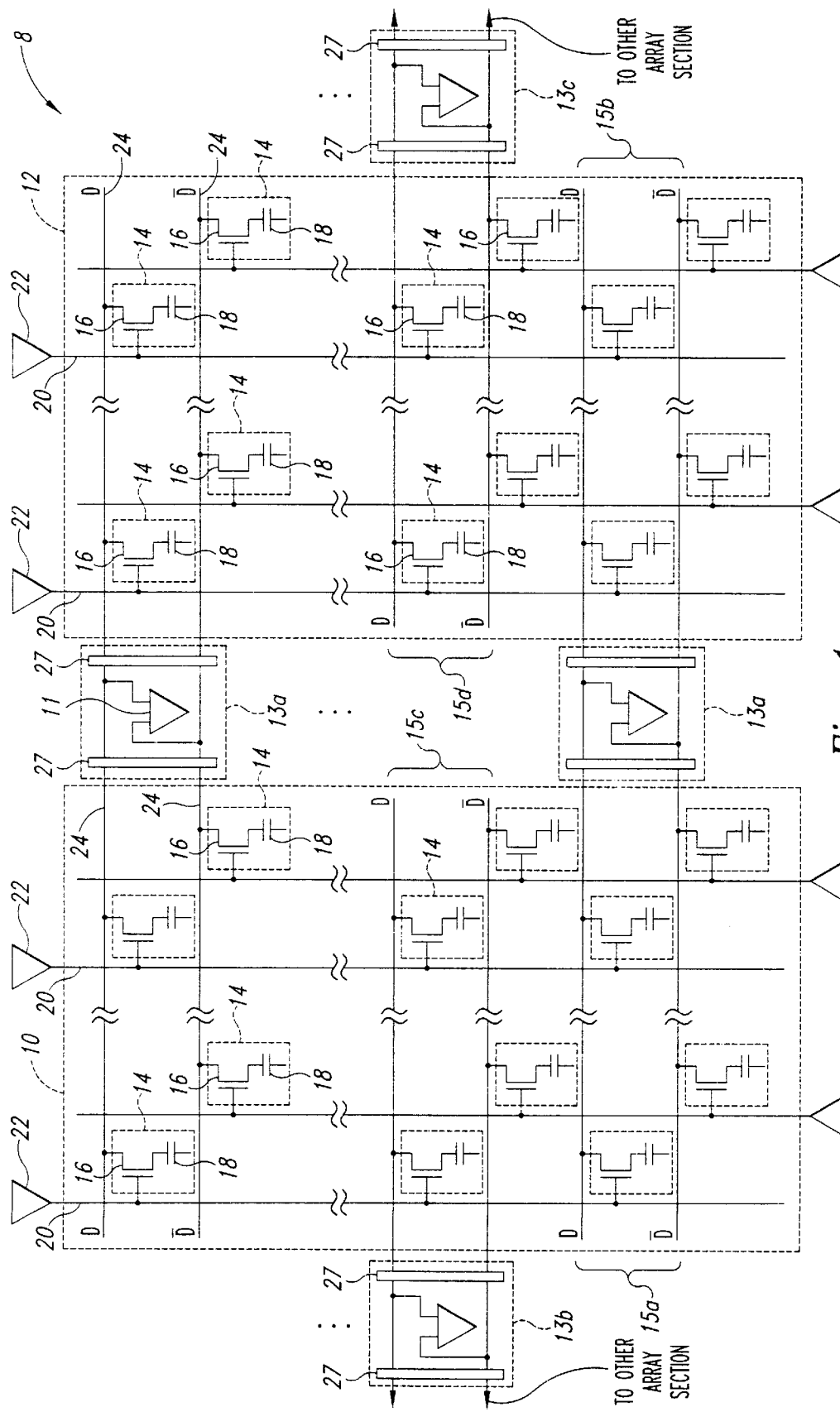
FIG. 1 is a schematic diagram of a portion of a conventional memory circuit.
Figure 2:
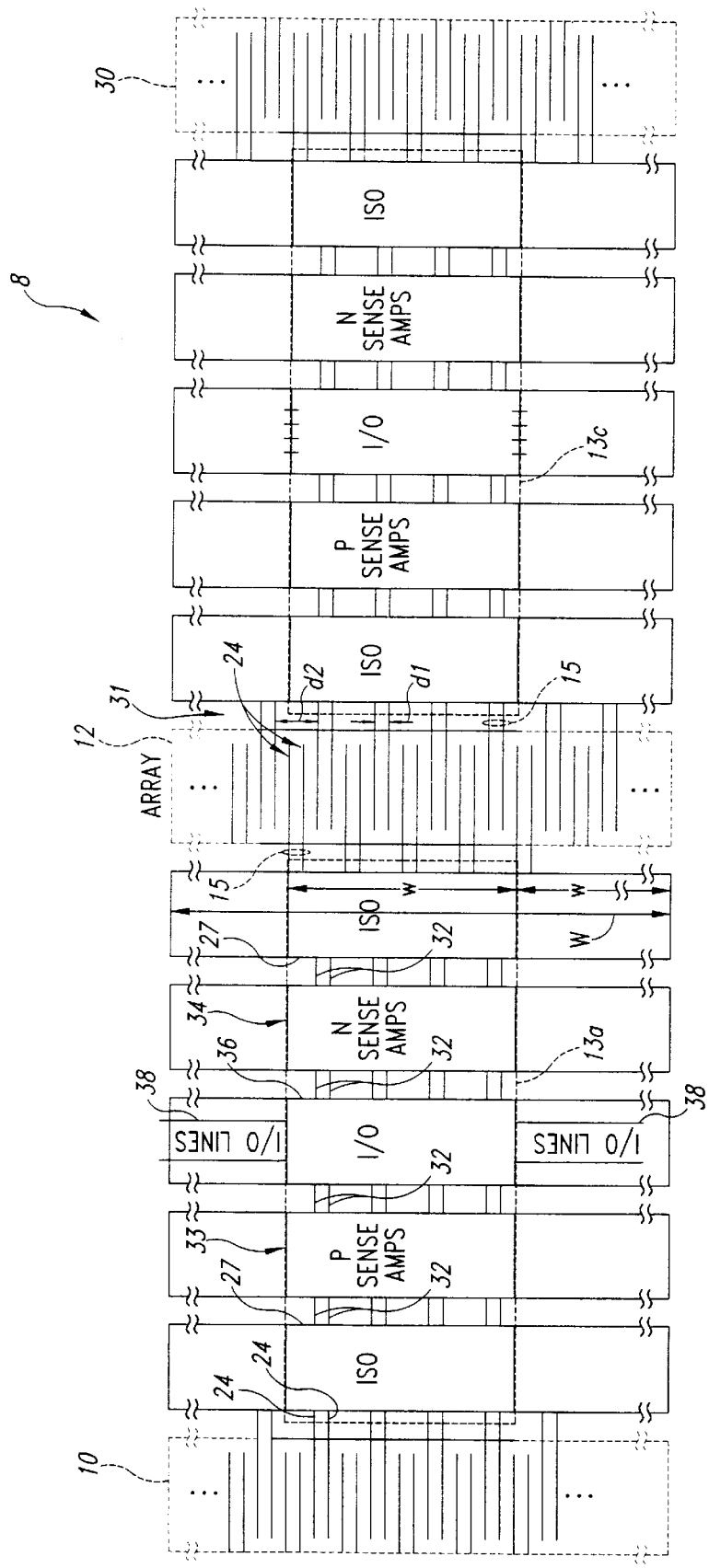
FIG. 2 is a block diagram of the array sections and sense-amplifier blocks of the memory circuit of FIG. 1.
Figure 3:
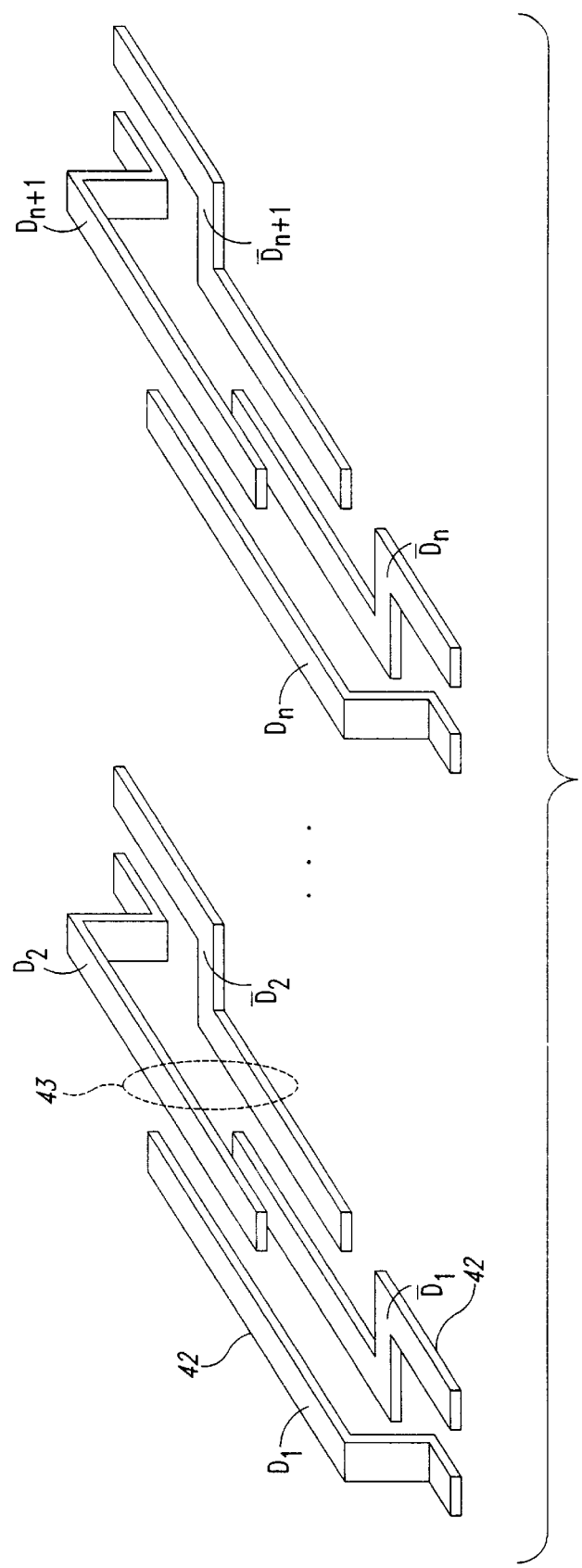
FIG. 3 is an isometric view of digit lines arranged according to a bi-level architecture.

Still referring to FIGS. 5A and 5B, each sense-amplifier stage 58a and 58b includes an NMOS sense-amplifier section 68, an input/output circuit 70, and a PMOS sense-amplifier section 72, which in one embodiment occupy respective regions having the same width and are constructed and operate similarly to the NMOS section 34, input/output section 36, and PMOS section 33, respectively, of FIG. 2. Isolation circuits 66a, 66b are coupled to the respective sense-amplifier stages 58a, 58b, and to the respective array sections 54a, 54b. In one embodiment, the isolation circuits 66 are constructed such that the digit lines 62 are at the pitch d5 and in the same semiconductor layer as they enter, pass through, and emerge from the isolation circuit 66. However, because of the sizes of the transistors (not shown) that compose the NMOS and PMOS sections 68 and 72 and the input/output circuit 70, these components can only receive and operate on some of the digit lines 62 if the respective regions they occupy are to have the same width as the region occupied by the isolation circuit 66. Therefore, as discussed below, two amplifier stages 58a and 58b are used, one for each set 60a and 60b of the digit lines 62.

The digit lines 64a emerge from the array section 54a and enter the adjacent isolation circuit 66a at the same pitch d5 and in the same semiconductor layer. (See below and FIG. 5C for a discussion of the semiconductor structure in which the memory circuit 50 is disposed.) During a read or write cycle, the isolation circuit 66a couples the digit lines 64a to the digit lines 62 when the array section 54a is selected, and isolates the digit lines 64a from the digit lines 62 when the array section 54a is not selected.

After they emerge from the isolation circuit 66a, the set 60a of digit lines 62 are routed through the first semiconductor region 56a such that they are electrically coupled to the NMOS amplifier section 68a, the input/output circuit 70a, and the PMOS amplifier section 72a. Thus, during a read cycle, the first stage 58a amplifies and couples the data signals carried from the array section 54a by the first set 60a of digit lines 62 to the data bus through the input/output circuit 70a, and couples data signals from the data bus to the set 60a of digit lines 62 through the input/output circuit 70a during a write cycle.

Conversely, after they emerge from the isolation circuit 66a, the set 60b of digit lines 62 is routed through the first semiconductor region 56a such that they are electrically isolated from the NMOS amplifier section 68a, the input/output circuit 70a, and the PMOS amplifier section 72a. For example, the set 60b of digit lines 62 may be routed in a semiconductor layer that is above the layers and the substrate portions in which these components of the amplifier stage 58a are disposed. Or, the set 60b of digit lines 62 may be routed through the substrate beneath these components. It is also possible for the set 60b of digit lines 62 to be routed in the same layers in which the components of the amplifier stage 58a are disposed while still maintaining electrical isolation from these components.

As the sets 60a and 60b of digit lines emerge from the first region 56a into an intermediate region 74, they are routed in the semiconductor layers so as to facilitate electrical coupling of the set 60b of digit lines 62 to the stage 58b and to facilitate electrical isolation of the set 60a of digit lines 62 from the stage 58b. In one embodiment, the set 60b is routed to lower ones of the semiconductor layers and the set 60a is routed to upper ones of the semiconductor layers.

The sets 60a and 60b of digit lines 62 enter the region 56a from the region 74. The set 60b is routed through the regions occupied by and is electrically coupled to the PMOS section 72b, the input/output circuit 70b, and the NMOS section 68b. Conversely, the set 60a is routed past these components, either in semiconductor layers that are above the layers that these components occupy, or through the substrate below these components, such that the set 60a is electrically isolated from the NMOS and PMOS sections 68b, 72b, and the input/output circuit 70b. Again, the set 60a may also be routed through the semiconductor layers that are occupied by the components while still maintaining electrical isolation from them. As the sets 60a and 60b approach the isolation circuit 66b, they are routed to the same semiconductor layer such that they enter the circuit 66b at the pitch d5 and are electrically coupled thereto. The digit lines 64b also enter the isolation circuit 66b at the pitch d5. During a read or write cycle, the circuit 66b couples the digit lines 62 to the digit lines 64b when the array section 54b is selected, and isolate the digit lines 62 from the digit lines 64b when the array section 54b is not selected.

Therefore, by routing the digit lines 62 as discussed above, the amplifier stages 58a and 58b can be cascaded such that the combined widths of the sense-amplifier blocks 52 do not exceed the width of the adjacent array sections 54.

Although the embodiment of FIG. 5 shows a sense-amplifier block 52 with four digit lines 64 emerging from the memory arrays 54a and 54b and entering the block 52, in a more general sense, the sense-amplifier block 52 may comprise N digit line pairs (each comprising two digit lines 64a) from a first memory array, such as memory array 54a, M sense-amplifier circuits 58a in a first region 56a, X digit line pairs (each comprising two digit lines 64b) from a second memory array, such as memory array 54b, and Y sense-amplifier circuits 58b in a second region 56b.

The N digit-line pairs are coupled to the M sense-amplifier circuits 58a, one digit-line pair per sense-amplifier circuit. Significantly, M is at most equal to N−1. Therefore, at least one of the N digit-line pairs is not coupled to one of the M sense-amplifier circuits. Instead, the digit line pairs that are not coupled to one of the M sense-amplifier circuits 58a (equal to N−M) continue into the second region 56b, and are coupled to respective ones of the Y sense-amplifier circuits 58b, one digit-line pair per sense-amplifier circuit.

The X digit-line pairs are coupled to the Y sense-amplifier circuits 58b, one digit-line pair per sense-amplifier circuit.

Significantly, Y is at most equal to X−1. Therefore, at least one of the X digit-line pairs is not coupled to one of the Y sense-amplifier circuits. Instead, the digit line pairs that are not coupled to one of the Y sense-amplifier circuits 58b (equal to X−Y) continue into the first region 56a, and are coupled to respective ones of the M sense-amplifier circuits 58a, one digit-line pair per sense-amplifier circuit.

Thus, because at least one digit-line pair from each set of digit lines N and X pass through one respective region 56a, 56b and into the other respective region 56b, 56a for amplification, additional digit lines (equal to N−M and X−Y) may be amplified within a given width as compared to conventional sense-amplifier layouts (as described above). In fact, N (or X) digit lines from a single memory array may be amplified within a region no wider than the regions 56a and 56b, with the width of the regions 56a and 56b typically being no wider than a width required by conventional sense-amplifier circuit layouts to amplify only ½ N (or ½ X) digit-line pairs (as discussed above).

FIG. 5C is a cross section of one embodiment of a semiconductor structure 73 in which the memory circuit 50 is formed. The structure 73 includes a semiconductor substrate 75 having layers 76, 77, 78, 79, 80, and 81 disposed thereon. The layers 76, 78, and 80 are dielectric layers, and the layers 77, 79, and 81 are conductive layers. There may be additional or fewer conductive and dielectric layers. Some of the circuit elements that make up the sense-amplifier block 52, such as transistors (not shown), that make up the NMOS and PMOS sections 68 and 72, may be partially or fully disposed within the substrate 75. The digit lines 60 (FIGS. 5A–5B) are routed in at least one of the conductive layers 77, 79, and 81, and may be electrically coupled to the circuit elements disposed in the substrate 75. The digit lines 60 may also be electrically isolated from the circuit elements within the substrate 75 by disposing at least one nonconductive layer between the digit lines and the circuit elements within the substrate 75. Thus, for example, within the region 56a, the layers 77 or 79 may contain the digit lines 60a, which are electrically coupled to the stage 58a, some circuit elements of which are disposed in the substrate 75. Conversely, the digit lines 60b, which are not coupled to the stage 58a, may be routed through the conductive layer 81, which is electrically isolated from the substrate 75 and the digit lines 60a by the dielectric layer 80. Similarly, the digit lines 60a and 60b may be respectively routed through layers 81 and 77 or 79 within the region 56b so that the digit lines 60b are electrically coupled to circuit elements of the stage 58b and the digit lines 60a are electrically isolated from these circuit elements and the digit lines 60b.

Figure 6A:
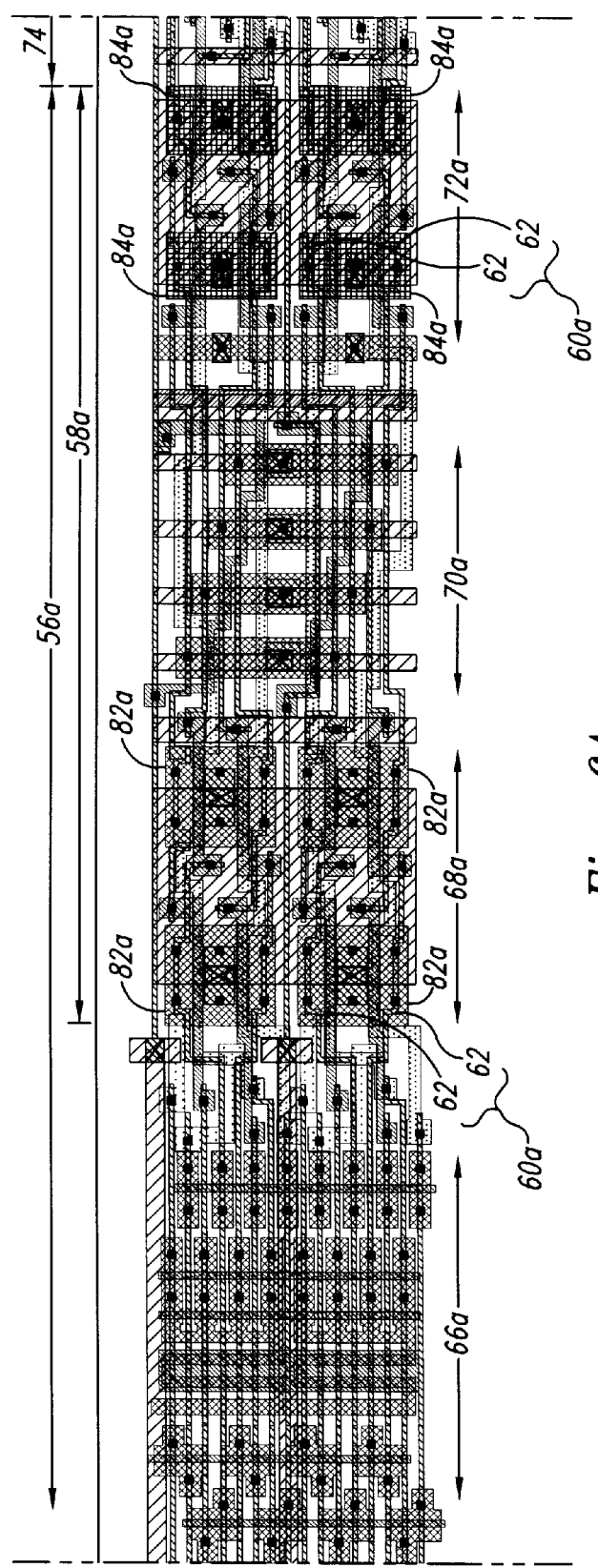
FIG. 6 is a layout diagram of one embodiment of the sense-amplifier block of FIGS. 5A, 5B, and 5C.
Figure 6B:
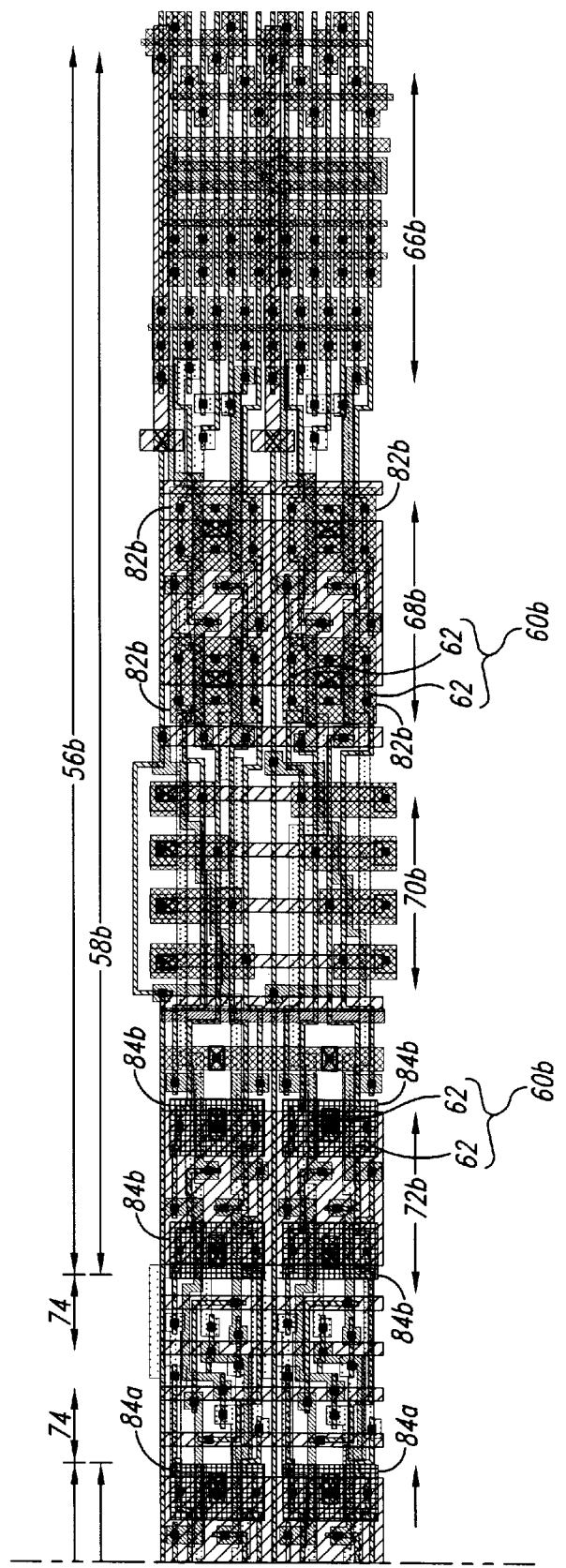

FIG. 6 is a layout diagram of one embodiment of the sense-amplifier block 52 of FIGS. 5A, 5B and 5C. In this embodiment, the NMOS sections 68a and 68b each include four transistor pairs 82a and 82b, respectively. The transistor pairs 82a are coupled to respective complementary pairs of digit lines 62 from the set 60a, and the transistor pairs 82b are coupled to respective complementary pairs of digit lines 62 from the set 60b. Likewise, the PMOS sections 72a and 72b each include four transistor pairs 84a and 84b, respectively. The transistor pairs 84a are coupled to respective complementary pairs of digit lines 62 from the set 60a, and the transistor pairs 84b are coupled to respective complementary pairs of digit lines 62 from the set 60b. At least one data-line pair 60b passes through the semiconductor region 56a electrically isolated from the first amplifier stage 58a and is coupled to the second amplifier stage 58b. Similarly, at least one data-line pair 60a is coupled to the first amplifier stage 58a and passes through the second amplifier stage 58b, electrically isolated from the second amplifier stage 58b.

Figure 7:
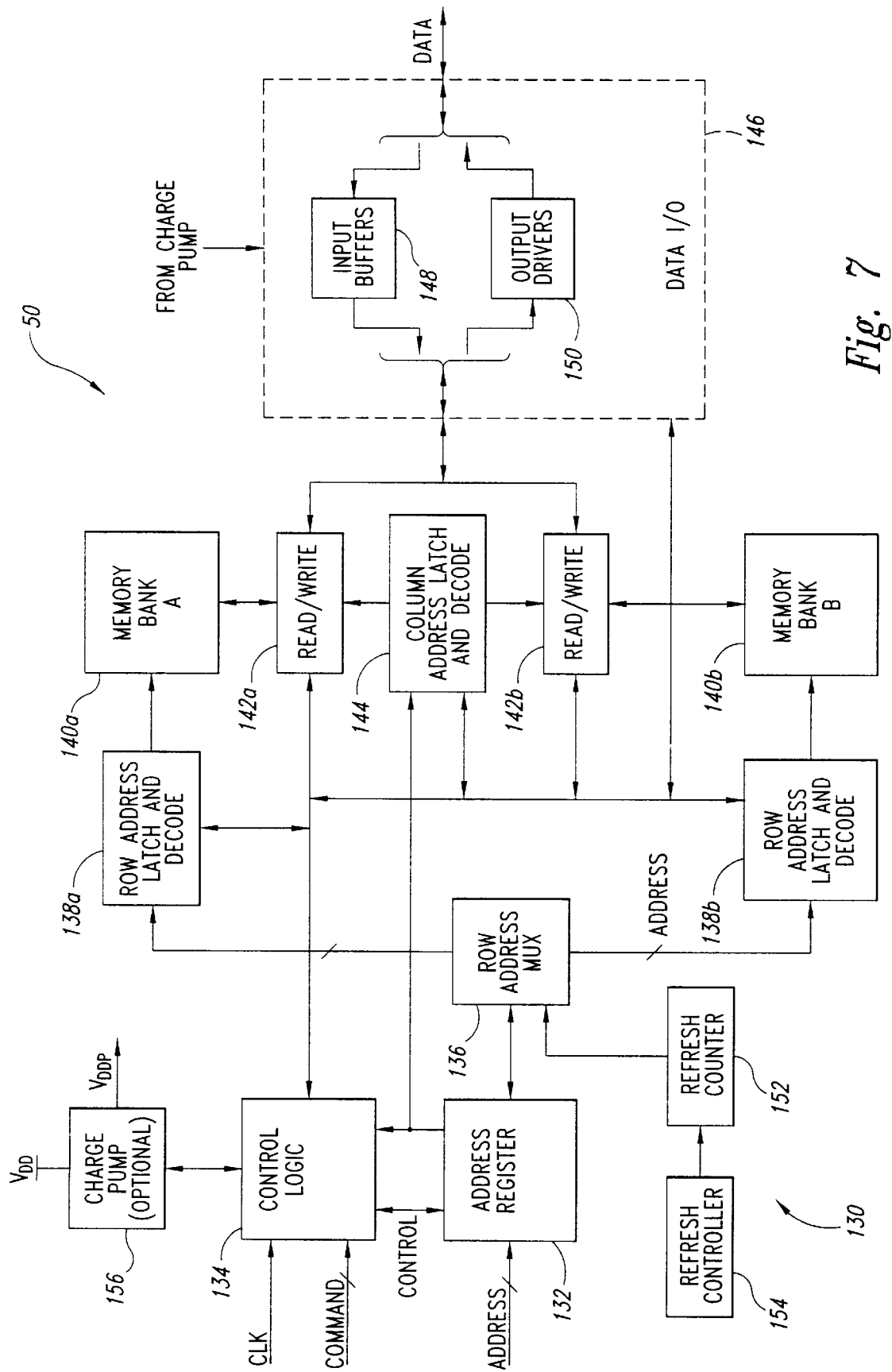
FIG. 7 is a schematic block diagram of the memory circuit of FIGS. 5A, 5B, and 5C.

FIG. 7 is a schematic block diagram of one embodiment of the memory circuit 50 of FIGS. 5A, 5B, and 5C. The memory circuit 50 includes an address register 132, which receives an address from an ADDRESS bus. A control logic circuit 134 receives a clock (CLK) signal, and receives clock enable (CKE), chip select ($\overline{CS}$), row address strobe ($\overline{RAS}$), column address strobe ($\overline{CAS}$) and write enable ($\overline{WE}$) signals from a COMMAND bus, and communicates with the other circuits of the memory circuit 50. A row address multiplexer 136 receives the address signal from the address register 132 and provides the row address to the row-address latch-and-decode circuits 138a and 138b for the memory bank 140a or 140b, respectively. During read and write cycles, the row-address latch-and-decode Circuits 138a and 138b activate word lines of the addressed rows of memory cells in the memory banks 140a and 140b, respectively. Read/write circuits 142a and 142b read data from the addressed memory cells in the memory banks 140a and 140b, respectively, during a read cycle, and write data to the addressed memory cells during a write cycle. The read/write circuits 142a, 142b include the sense-amplifier block 52 of FIGS. 5A, 5B, and 5C. The memory banks 140a, 140b include the array sections 54a and 54b, respectively, of FIGS. 5A, 5B, and 5C. A column-address latch-and-decode circuit 144 receives the address from the address register 132 and provides the column address of the selected memory cells to the read/write circuits 142a and 142b. For clarity, the address register 132, the row-address multiplexer 136, the row-address latch-and-decode circuits 138a and 138b, and the column-address latch-and-decode circuit 144 can be collectively referred to as an address decoder.

A data input/output (I/O) circuit 146 includes a plurality of input buffers 148. During a write cycle, the buffers 148 receive and store data from the external DATA bus, and the read/write circuits 142a and 142b provide the stored data to the memory banks 140a and 140b, respectively. The data I/O circuit 146 also includes a plurality of output drivers 150. During a read cycle, the read/write circuits 142a and 142b provide data from the memory banks 140a and 140b, respectively, to the drivers 150, which in turn provide this data to the DATA bus.

A refresh counter 152 stores the address of the row of memory cells to be refreshed either during conventional auto-refresh mode or self-refresh mode. After the row is refreshed, a refresh controller 154 updates the address in the refresh counter 152, typically by either incrementing or decrementing the contents of the refresh counter 152 by one. Although shown separately, the refresh controller 154 may be pail of the control logic 134 in other embodiments of the memory device 130.

The memory circuit 50 may also include an optional charge pump 156, which steps up the power-supply voltage $V_{DD}$ to a voltage $V_{DDP}$. In one embodiment, the pump 156 generates $V_{DDP}$ approximately 1–1.5 V higher than $V_{DD}$. The memory circuit 130 may also use $V_{DDP}$ to conventionally overdrive selected internal transistors.

Figure 8:
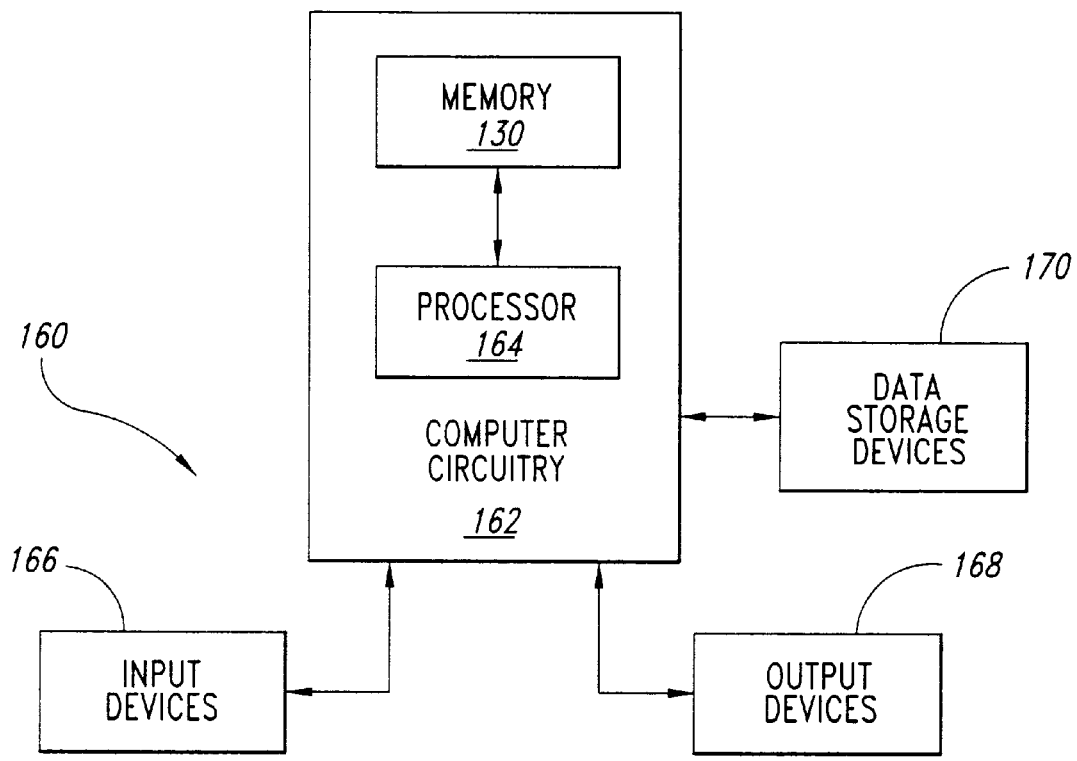
FIG. 8 is a schematic block diagram of an electronic system that incorporates the memory circuit of FIG. 7.

FIG. 8 is a block diagram of an electronic system 160, such as a computer system, that incorporates the memory circuit 50 of FIG. 7. The system 160 includes computer circuitry 162 for performing computer functions, such as executing software to perform desired calculations and tasks. The circuitry 162 typically includes a processor 164 and the memory circuit 50, which is coupled to the processor 164. One or more input devices 166, such as a keyboard or a mouse, are coupled to the computer circuitry 162 and allow an operator (not shown) to manually input data thereto. One or more output devices 168 are coupled to the computer circuitry 162 to provide to the operator data generated by the computer circuitry 162. Examples of such output devices 168 include a printer and a video display unit. One or more data-storage devices 170 are coupled to the computer circuitry 162 to store data on or retrieve data from external storage media (not shown). Examples of the storage devices 170 and the corresponding storage media include drives that accept hard and floppy disks, tape cassettes, and compact disk read-only memories (CD-ROMs). Typically, the computer circuitry 162 includes address data and command buses and a clock line that are respectively coupled to the ADDRESS, DATA, and COMMAND buses, and the CLK line of the memory device 50.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory circuit, comprising:

a semiconductor structure;

a first amplifier stage disposed in a first region of the semiconductor structure;

a second amplifier stage disposed in a second region of the semiconductor structure;

a memory array disposed in the semiconductor structure, the memory array having a plurality of memory cells arranged in rows and columns, each cell operable to store a data bit;

a first set of digit lines coupled to the memory array, extending from the memory array and into the first region, and coupled to the first amplifier stage; a second set of digit lines coupled to the memory allay, extending from the memory array through the first region and into the second region, coupled to the second amplifier stage, and electrically isolated from the first amplifier stage;

an addressing circuit disposed in the semiconductor structure and coupled to the memory array, the addressing circuit operable to receive row and column addresses and to activate a corresponding memory cell in the memory array; and a data path circuit coupling the first and second amplifier stages to a data bus terminal.

2. The memory circuit of claim 1 wherein:

the first set of digit lines extend through the first and second regions and are electrically isolated from the second amplifier stage; and the second set of digit lines extend through the second region.

3. The memory circuit of claim 1 wherein the first and second amplifier stages comprise respective sense amplifiers.

4. The memory circuit of claim 1 wherein the first region is contiguous with the second region.

5. The memory circuit of claim 1 wherein the first region is contiguous and aligned with the second region.

6. The memory circuit of claim 1 wherein:

the first region has first and second opposite sides;

the second region has first and second opposite sides, the first sides of the first and second regions being Contiguous with one another;

the memory array is adjacent to the second side of the first region; and the first and second sets of digit lines extend into the second side of the first region, through the first sides of the first and second regions, and out of the second side of the second region.

7. The memory circuit of claim 1 wherein:

the semiconductor structure comprises a substrate and layers disposed on the substrate; and the first and second sets of digit lines are disposed in one or more of the layers.

8. The memory circuit of claim 1 wherein:

the first set of digit lines includes a first plurality of digit lines; and the second set of digit lines includes a second plurality of digit lines.

9. A memory circuit, comprising:

a semiconductor structure;

a first amplifier stage disposed in a first region of the semiconductor structure, the first amplifier stage including, a first sense-amplifier circuit, and a first isolation circuit operable to couple and decouple digit lines from the first sense-amplifier circuit and a second sense-amplifier circuit;

a second amplifier stage disposed in a second region of the semiconductor structure, the second amplifier stage including, the second sense-amplifier circuit, and a second isolation circuit operable to couple and decouple digit lines from the first and second sense amplifier circuits;

a first memory array disposed in the semiconductor structure and including a first set of digit lines coupled to the first isolation circuit, the memory array having a plurality of memory cells arranged in rows and columns, each cell operable to store a data bit;

a second memory array disposed in the semiconductor structure and including a second set of digit lines coupled to the second isolation circuit, the memory array having a plurality of memory cells arranged in rows and columns, each cell operable to store a data bit;

a third set of digit lines respectively coupled to the first isolation circuit, the first sense-amplifier circuit, and the second isolation circuit, the third set of digit lines extending from the first isolation circuit through the first and second regions to the second isolation circuit, the third set of digit lines being electrically isolated from the second sense-amplifier circuit;

a fourth set of digit lines respectively coupled to the second isolation circuit, the second sense-amplifier circuit, and the first isolation circuit, the fourth set of digit lines extending from the second isolation circuit through the second and first regions to the first isolation circuit, the fourth set of digit lines being electrically isolated from the first sense-amplifier circuit;

an addressing circuit disposed in the semiconductor structure and coupled to the first and second memory arrays, the addressing circuit operable to receive row and column addresses and to activate a corresponding memory cell in the memory arrays; and a data path circuit coupling the third and fourth digit lines to a data bus terminal.

10. The memory circuit of claim 9 wherein each of the first and second sense-amplifier circuits comprise:

a respective PMOS amplifier section; and a respective NMOS amplifier section.

11. The memory circuit of claim 9 wherein each of the first and second isolation circuits comprise a respective equilibration circuit.

12. The memory circuit of claim 9, further comprising:

a data bus; wherein the first amplifier stage includes a first input/output circuit coupled to the data path circuit and the third set of digit lines, the first input/output circuit being electrically isolated from the fourth set of digit lines;

wherein the second amplifier stage includes a second input/output circuit coupled to the data path circuit and the fourth set of digit lines, and the first input/output circuit being electrically isolated from the fourth set of digit lines; and wherein the data path circuit is coupled to the third and fourth digit lines through the first and second input/output circuits respectively.

13. The memory circuit of claim 9 wherein the first and second sets of digit lines are arranged according to a bi-level architecture within the first and second memory arrays respectively.

14. The memory circuit of claim 9 wherein the number of first digit lines equals the number of second digit lines.

15. The memory circuit of claim 9 wherein:

the semiconductor structure comprises a substrate and layers disposed on the substrate;

the first set of digit lines each having a respective first portion disposed in the first memory array and a respective second portion disposed between the first memory array and the first isolation circuit, the first set of digit lines arranged in pairs, the first portion of one digit line of each pair disposed in a first one of the layers and the first portion of the other digit line of each pair disposed in a second one of the layers, the second portions of the first set of digit lines disposed in a third one of the layers; and the second set of digit lines each having a respective first portion disposed in the second memory array and a respective second portion disposed between the second memory array and the second isolation circuit, the second set of digit lines arranged in pairs, the first portion of one digit line of each pair disposed in a fourth one of the layers and the first portion of the other digit line of each pair disposed in a fifth one of the layers, the second portions of the first set of digit lines disposed in a sixth one of the layers.

16. The memory circuit of claim 15 wherein:

the first and fourth layers comprise the same layer;

the second and fifth layers comprise the same layer; and the third and sixth layers comprise the same layer.

17. The memory circuit of claim 9 wherein:

the semiconductor structure comprises a substrate and layers disposed on the substrate;

the first set of data terminals are disposed in a first one of the layers;

the second set of data terminals are disposed in a second one of the layers;

the first set of digit lines each having a respective first portion disposed in the first memory array and a respective second portion disposed between the first memory array and the first set of data terminals, the first set of digit lines arranged in pairs, the first portion of one digit line of each pair disposed in a third one of the layers and the first portion of the other digit line of each pair disposed in a fourth one of the layers; and the second set of digit lines each having a respective first portion disposed in the second memory array and a respective second portion disposed between the second memory array and the second set of data terminals, the second set of digit lines arranged in pairs, the first portion of one digit line of each pair disposed in a fifth one of the layers and the first portion of the other digit line of each pair disposed in a sixth one of the layers.

18. The memory circuit of claim 17 wherein:

the first and second layers comprise ie same layer;

the third and fifth layers comprise the same layer; and the fourth and sixth layers comprise the same layer.

19. A sense-amplifier block that can be used with a bi-level architecture memory array, the sense-amplifier block comprising:

N digit line pairs, each of the N digit line pairs operable to carry a signal, the N digit line pairs coupled to and passing through and out of the sense-amplifier block;

M sense-amplifier circuits disposed in a first region and coupled to the N digit line pairs, M being no more than N−1, each of the M sense-amplifier circuits coupled to no more than one of the N digit line pairs, and operable to amplify only a signal on each digit line pair to which the sense-amplifier circuit is coupled;

X digit line pairs, each of the X digit line pairs operable to carry a signal, the X digit line pairs coupled to and passing through and out of the sense-amplifier block;

Y sense-amplifier circuits disposed in a second region and coupled to the X digit line pairs, Y being no more than X−1, each of the Y sense-amplifier circuits coupled to no more than one of the X digit line pairs, and operable to amplify only a signal on each digit line pair to which the sense-amplifier circuit is coupled;

N−M of the N digit line pairs being electrically isolated from the M sense-amplifier circuits and respectively coupled to the Y sense-amplifier circuits; and X−Y of the X digit line pairs being electrically isolated from the Y sense-amplifier circuits and respectively coupled to the M sense-amplifier circuits.

20. The sense-amplifier block of claim 19 wherein the N digit line pairs that are coupled to the M sense-amplifier circuits ss through the first region at a first level, and the N−M of the N digit line pairs that are not coupled to the N−1 sense-amplifier circuits pass through the first region at a second level.

21. The sense-amplifier block of claim 20 wherein the second level comprises a different level than the first level.

22. The sense-amplifier block of claim 19 wherein the X digit line pairs that are coupled to the Y sense-amplifier circuits pass through the second region at a first level, and the X−Y of the X digit line pairs that are not coupled to the Y sense-amplifier circuits pass through the second region at a second level.

23. The sense-amplifier block of claim 22 wherein the second level comprises a different level than the first level.

24. The sense-amplifier block of claim 19 wherein the N digit line pairs are horizontally aligned at a point where the N digit line pairs are coupled to the sense-amplifier block.

25. The sense-amplifier block of claim 19 wherein the X digit line pairs are horizontally aligned at a point where the X digit line pairs are coupled to the sense-amplifier block.

26. A memory device for storing a plurality of data bits, comprising:

an address bus:

N memory arrays each having a width W, the memory array each having a plurality of memory cells arranged in rows and columns, each cell operable to store a data bit, the combined width of the memory cell arrays having a width of approximately the product of N and W;

an addressing circuit coupled to the address bus and the memory array, the addressing circuit operable to receive row and column addresses on the address bus and to activate a corresponding memory cell in the array;

a plurality of column lines in each memory array coupled to the respective columns of memory cells in each memory array;

a plurality of sense-amplifier blocks each containing a plurality of sense amplifiers coupled to a respective plurality of the column lines, the sense amplifiers in each sense-amplifier block being approximately aligned with the respective columns of memory cells, each sense-amplifier block operable to amplify a signal on the respective column lines to which the block is coupled, the combined width of the sense amplifier blocks having a width of approximately the product of N and W; and a data path circuit operable to couple the signal on a column line to an external terminal.

27. The memory device of claim 26 wherein the sense-amplifier blocks extend in a direction approximately normal to the memory array.

28. The memory device of claim 26 wherein the sense-amplifier blocks extend in a lateral direction approximately normal to a boundary of the memory array.

29. An electronic system, comprising:

a data input device;

a data output device;

processing circuitry coupled to the data input and data output devices; and a memory circuit coupled to the processing circuitry, comprising:
 a semiconductor structure;
 a first amplifier stage disposed in a first region of the semiconductor structure;
 a second amplifier stage disposed in a second region of the semiconductor structure;
 a memory array disposed in the semiconductor structure, the memory array having a plurality of memory cells arranged in rows and columns, each memory cell operable to store a data bit;
 a first set of digit lines coupled to the memory array, extending from the memory array and into the first region, and coupled to the first amplifier stage;
 a second set of digit lines coupled to the memory array, extending from the memory array through the first region and into the second region, coupled to the second amplifier stage, and electrically isolated from the first amplifier stage;
 an addressing circuit disposed in the semiconductor structure, the addressing circuit coupled to the memory array and operable to receive row and column addresses and to activate a corresponding memory cell in the array; and
 a data path circuit coupling the first and second amplifier stages to a data bus terminal.

30. An electronic system, comprising:

a data input device;

a data output device;

processing circuitry coupled to the data input and data output devices; and a memory circuit coupled to the processing circuitry, comprising:
 a semiconductor structure;
 a first amplifier stage disposed in a first region of the semiconductor structure, the first amplifier stage including,
  a first sense-amplifier circuit, and
  a first isolation circuit operable to couple and decouple digit lines from the first sense-amplifier circuit and a second sense-amplifier circuit;
 a second amplifier stage disposed in a second region of the semiconductor structure, the second amplifier stage including,
  the second sense-amplifier circuit, and
  a second isolation circuit operable to couple and decouple digit lines from the first and second sense-amplifier circuits;
 a first memory array disposed in the semiconductor structure and including a first set of digit lines coupled to the first isolation circuit, the first memory array having a plurality of memory cells arranged in rows and columns, each memory cell operable to store a data bit;
 a second memory array disposed in the semiconductor structure and including a second set of digit lines coupled to the second isolation circuit, the second memory array having a plurality of memory cells arranged in rows and columns, each memory cell operable to store a data bit;
 a third set of digit lines respectively coupled to the first isolation circuit, the first sense-amplifier circuit, and the second isolation circuit, the third set of digit lines extending from the first isolation circuit through the first and second regions to the second isolation circuit, the set of digit lines being electrically isolated from the second sense-amplifier circuit;
 a fourth set of digit lines respectively coupled to the second isolation circuit, the second sense-amplifier circuit, and the first isolation circuit, the fourth set of digit lines extending from the second isolation circuit through the second and first regions to the first isolation circuit, the fourth set of digit lines being electrically isolated from the first sense-amplifier circuit;
 an addressing circuit disposed in the semiconductor structure, the addressing circuit coupled to the first and second memory arrays and operable to receive row and column addresses and to activate a corresponding memory cell in the first and second arrays; and
 a data path circuit coupling the third and fourth sets of digit lines to a data bus terminal.

31. A method of configuring a memory array and an amplifier, comprising:

routing a first set of digit lines from a memory array into a first region of a semiconductor structure, the first region including a first amplifier stage;

coupling the first set of digit lines to the first amplifier stage;

routing a second set of digit lines from the memory array, through the first region, and into a second region of the semiconductor structure, the second region including a second amplifier stage;

coupling the second set of digit lines to the second amplifier stage; and electrically isolating the second set of digit lines from the first amplifier stage.

32. The method of claim 31, further comprising:

wherein the routing a first set of digit lines comprises routing the first set of digit lines through the first and second regions;

wherein the routing the second set of digit lines comprises routing the second set of digit lines through the second region; and electrically isolating the first set of digit lines from the second amplifier stage.

33. The method of claim 31, further comprising forming the first amplifier stage aligned with the second amplifier stage.

34. The method of claim 31, further comprising:

forming the memory array adjacent to a first side of the first region; and wherein the routing of the first and second sets of digit lines comprise routing the first and second sets of digit lines through the first side of the first region, through contiguous sides of the first and second regions, and through a second side of the second region.

35. The method of claim 31, further comprising:

wherein the semiconductor structure comprises a substrate; and wherein the routing of the first and second sets of digit lines comprises routing the first and second sets of digit lines over the substrate.

36. The method of claim 31 wherein each of the first and second sets of digit lines comprises multiple digit lines.

* * * * *